(12) United States Patent
Carpenter et al.

(10) Patent No.: US 7,667,513 B2
(45) Date of Patent: Feb. 23, 2010

(54) DIGITAL DUTY CYCLE CORRECTOR

(75) Inventors: Gary D. Carpenter, Austin, TX (US);
Alan J. Drake, Round Rock, TX (US);
Fadi H. Gebara, Austin, TX (US);
Chandler T. McDowell, Austin, TX (US); Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 781 days.

(21) Appl. No.: 10/988,454

(22) Filed: Nov. 12, 2004

(65) Prior Publication Data

US 2006/0103441 A1    May 18, 2006

(51) Int. Cl.
*H03K 3/017* (2006.01)
(52) U.S. Cl. .................. 327/175; 327/172
(58) Field of Classification Search ............ 327/172, 327/173, 174, 175, 176
See application file for complete search history.

(56) References Cited

U.S. PATENT DOCUMENTS

| | | | |
|---|---|---|---|
| 3,675,133 A | 7/1972 | Frankeny et al. ............ 327/172 |
| 4,799,022 A | 1/1989 | Skierszkan ................... 327/175 |
| 5,243,456 A * | 9/1993 | Hirakata ....................... 398/189 |
| 5,367,200 A | 11/1994 | Leonida ......................... 327/33 |
| 5,452,333 A * | 9/1995 | Guo et al. .................... 375/371 |
| 6,040,726 A * | 3/2000 | Martin ........................ 327/175 |
| 6,411,145 B1 | 6/2002 | Kueng et al. ................. 327/175 |
| 6,677,792 B2 | 1/2004 | Kwak ........................... 327/158 |
| 6,690,202 B1 | 2/2004 | Groen et al. ................... 326/93 |
| 6,737,927 B2 | 5/2004 | Hsieh ........................... 331/74 |
| 6,958,639 B2 * | 10/2005 | Park et al. .................... 327/175 |

* cited by examiner

*Primary Examiner*—Lincoln Donovan
*Assistant Examiner*—Khareem E. Almo
(74) *Attorney, Agent, or Firm*—Garg Law Firm, PLLC; Rakesh Garg; Libby Z. Handelsman

(57) ABSTRACT

A circuit and method of correcting the duty cycle of digital signals is disclosed. The duty cycle of an input digital signal is measured and compared to a desired duty cycle. The leading edge of the input digital signal is passed to an output. The circuit and method adjust the falling edges at the output to achieve the desired duty cycle. The falling edges occur in response to rising edges of a delayed version of the input digital signal.

8 Claims, 9 Drawing Sheets

DIGITAL DUTY CYCLE CORRECTOR

CROSS-REFERENCE TO RELATED APPLICATIONS

The present invention is related to the following U.S. patent application which is incorporated herein by reference:

Ser. No. 10/988,455 entitled "METHOD AND APPARATUS FOR GENERATING NON-SKEWED COMPLEMENTARY SIGNALS THROUGH INTERPOLATION" filed Nov. 12, 2004.

TECHNICAL FIELD

The present invention relates in general to electronics, and in particular, to adjusting the duty cycle of a signal.

BACKGROUND INFORMATION

Various systems and circuits require controlling the duty cycle of a clock signal. For example, some processor-based systems need a clock signal to have a duty cycle of 50%. The duty cycle of 50% may be necessary for accurate control over critical timing margins. However, due to effects from distortion and skewing, a clock signal may have an undesired duty cycle much higher or lower than 50%. Other systems employ pulse-width modulation and require generating digital signals with varying duty cycles. Therefore, it is important to have the ability to manipulate the duty cycle of a digital signal. In addition, it is sometimes important to generate a desired duty cycle quickly, without long delay periods.

Delay-locked loops (DLLs) and phase-locked loops (PLLs) are two techniques for accomplishing a desired clock signal. A DLL can be used to synchronize two clock signals of the same frequency by delaying one of the signals until the phases of the two clock signals are aligned. A phase detector is used to determine the appropriate delay of one clock signal and a delay element delays the clock signal until the two signals are in phase, or locked. As the name suggests, the DLL locks phase only and the duty cycle is not necessarily locked, particularly in the presence of process variations. Therefore, what is needed is a low-latency circuit and method for adjusting the duty cycle of a clock signal without necessarily relying on DLLs or PLLs.

SUMMARY OF THE INVENTION

The present invention addresses the above issues by providing circuits and methods for generating digital signals with desired duty cycles.

One embodiment of the present invention is a duty cycle correction circuit having a first input that receives a first input signal having a first voltage level alternating between logic one state and logic zero state. The duty cycle correction circuit also has a first output signal that alternates between logic one state and logic zero state. The duty cycle correction circuit measures the duty cycle of the first output signal. The duty cycle correction circuit has a delay circuit for delaying the first input signal to produce a delayed signal. The delayed signal transitions between logic one state and logic zero state a delay time after corresponding transitions in the first input signal. The duty cycle correction circuit has a combining circuit for producing an output voltage level that has a first edge occurring substantially simultaneously with a rising edge of the first input. The first output signal has a second edge transition occurring in response to a rising edge of the delayed signal.

The foregoing has outlined rather broadly the features and technical advantages of the present invention in order that the detailed description of the invention that follows may be better understood. Additional features and advantages of the invention will be described in the following description.

BRIEF DESCRIPTION OF THE DRAWINGS

For a more complete understanding of the present invention, and the advantages thereof, refer to the following description and the accompanying drawings, in which:

FIG. 7($b$) is a diagram of voltage levels at various nodes for the circuit shown in FIG. 7($a$);

DETAILED DESCRIPTION

Figure 1:
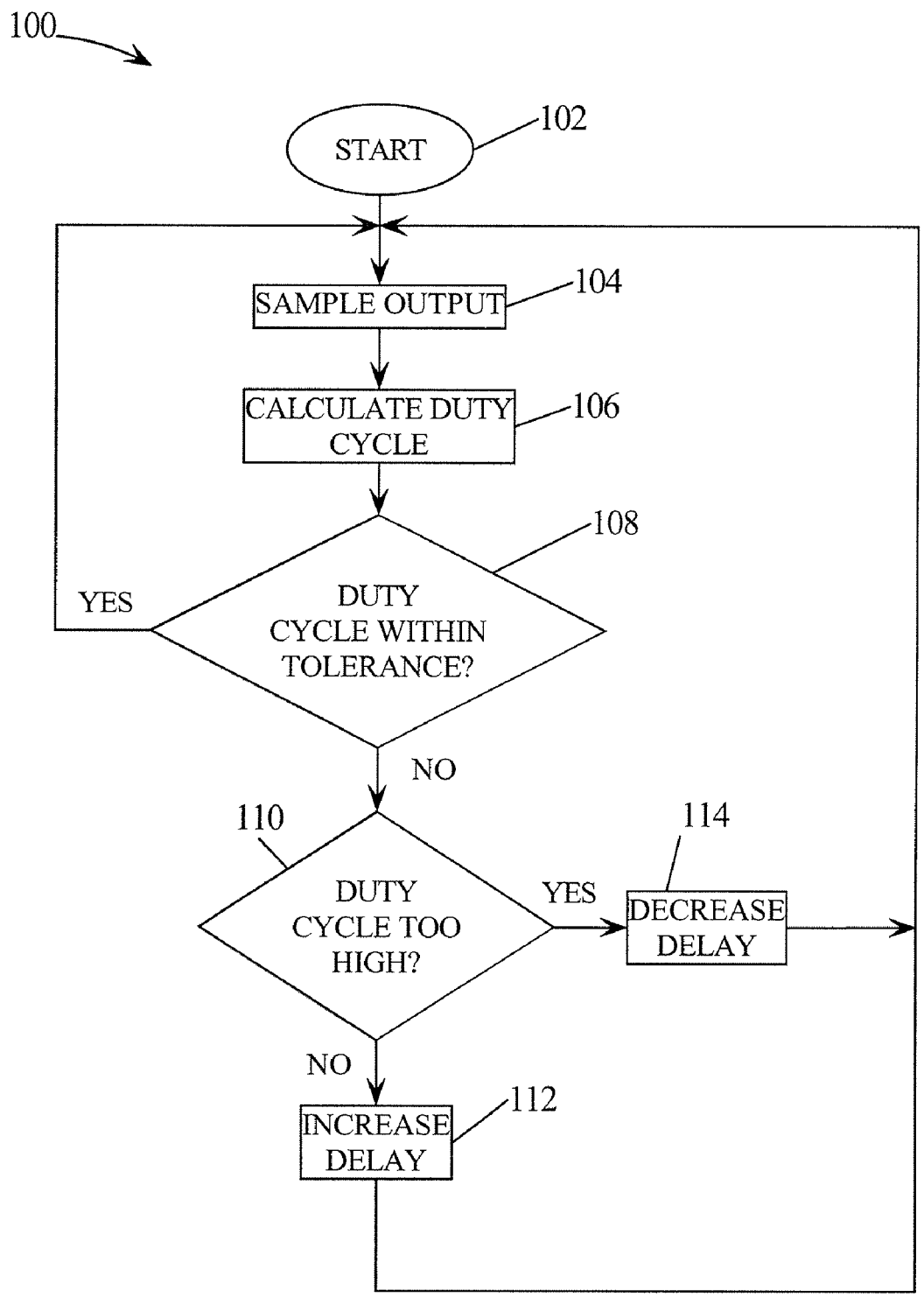
FIG. 1 is a flow diagram of a methodology performed in accordance with one embodiment of the present invention.

In the following description, numerous details are set forth such as specific circuit elements, gates, etc. to provide a thorough understanding of the present invention. However, it will be obvious to those skilled in the art that the present invention may be practiced without such specific details or using alternative hardware or software for accomplishing the same functions. In other instances, well-known circuits such as finite state machines have been shown in block diagram form in order not to obscure the present invention in unnecessary detail. Also, some details concerning timing considerations and the like may have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements may be designated by the same reference numeral through the several views.

FIG. 1 illustrates a methodology shown as item 100 for practicing one embodiment of the present invention. The methodology starts in step 102. In step 104, the output signal of a circuit is sampled to estimate its duty cycle. The output may be a digital signal with a voltage level that alternates between a voltage level representing a logic one state and a logic zero state. In step 106, the duty cycle of the output signal is calculated. The duty cycle may be calculated by sampling the output signal and determining a percentage of time the output spends at logic one state compared to the percentage of time the output spends at logic zero state. In step 108, a determination is made whether the duty cycle is within a tolerance value. For example, a determination may be made whether an output was within 2% (a tolerance value), of 50% (a desired value). If the duty cycle is within the tolerance value, then the process loops back to step 104 for more sampling. If the duty cycle is not within the tolerance value, then the process continues to step 110 to determine whether the duty cycle is too high. For example, if the duty cycle was measured to be 60% and the desired duty cycle was 50%, then step 110 would determine that the duty cycle was too high. If the duty cycle is determined to be too high, the process moves to step 114. In one embodiment of the present invention, decreasing a delay in a delayed input signal results in a lower duty cycle in the output signal. The decreased delay in the delayed input signal results in a falling edge of the output signal occurring sooner, thereby resulting in a lower duty cycle of the output signal. Conversely, if the duty cycle of the output signal is too low, then in step 112, the delay is increased in the delayed input signal used to adjust the duty cycle of the output signal. Therefore, increasing the delay or decreasing the delay in the delayed input signal in steps 112 or 114 affects the duty cycle of the output signal.

Figure 2:
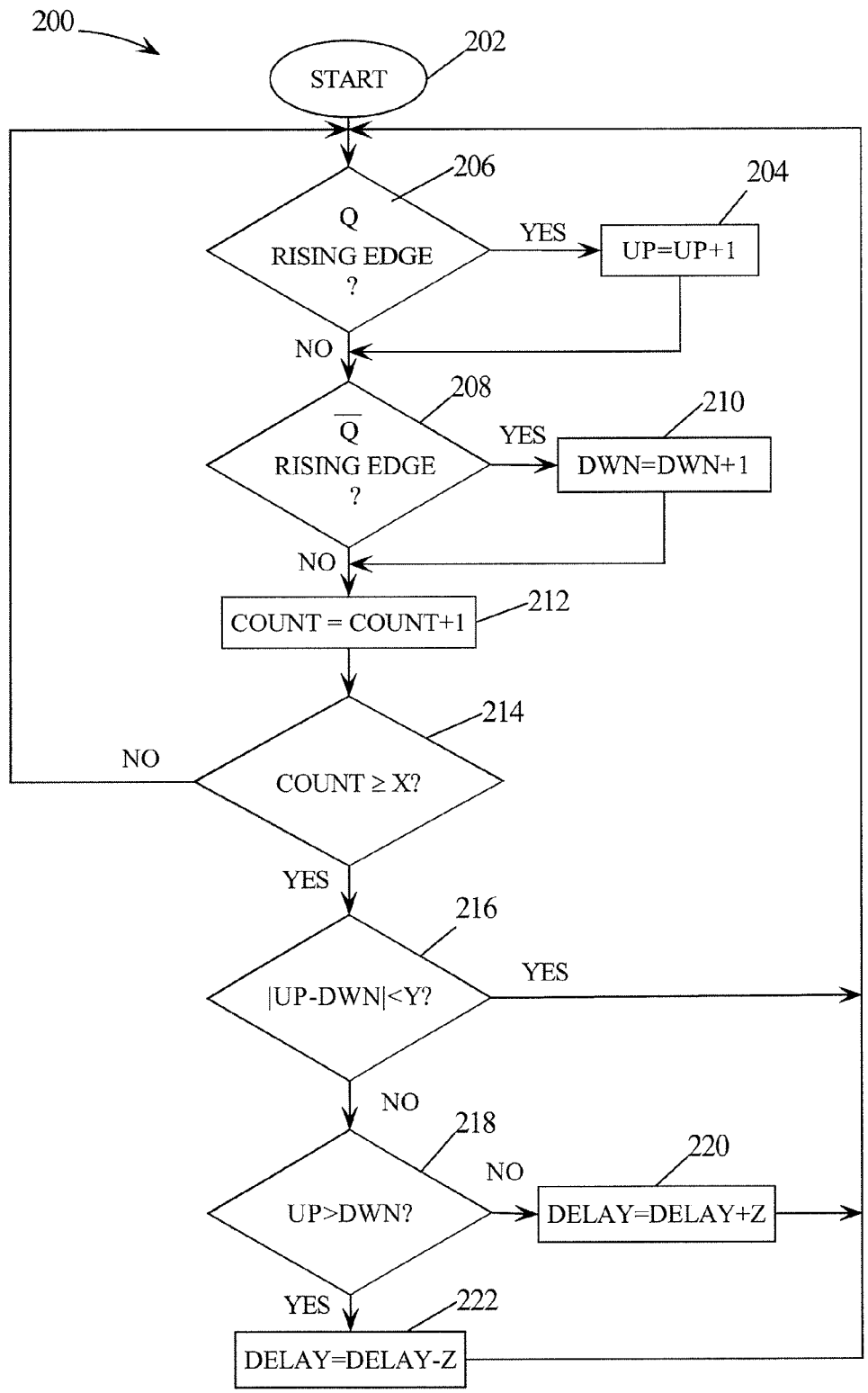
FIG. 2 is a flow diagram of a methodology performed in accordance with one embodiment of the present invention.
Figure 3:
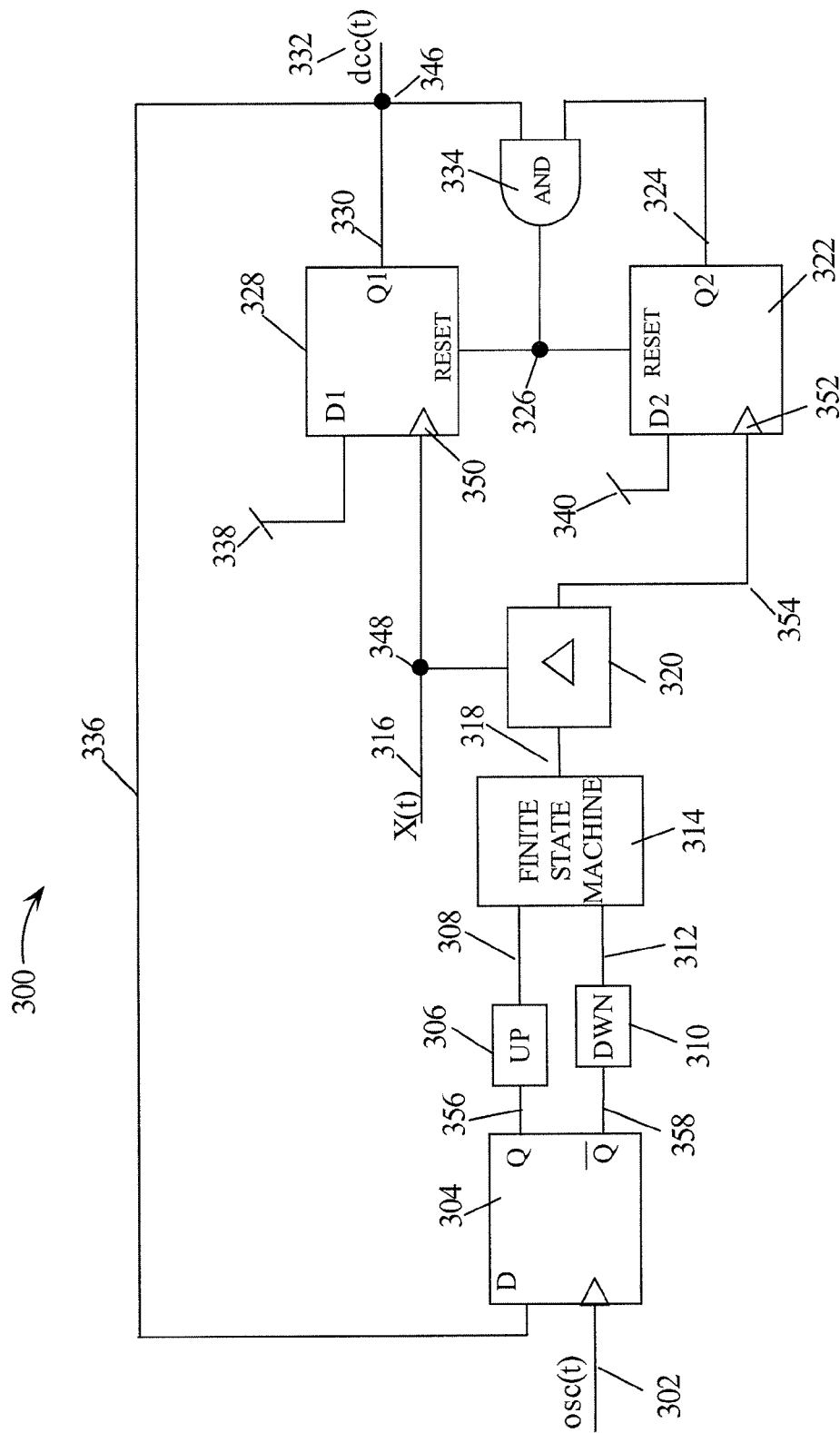
FIG. 3 is a circuit diagram of one embodiment of the present invention.

FIG. 2 is a flow diagram of methodology 200 performed in accordance with one embodiment of the present invention. The circuit 300 shown in FIG. 3 is suitable for performing the steps in methodology 200. Steps 204, 206, 208, 210, and 212 involve sampling an output signal to determine its duty cycle. The output signal could be any binary signal with a voltage level that alternates between logic one state and logic zero state. In step 206, a determination is made whether there is a rising edge for the output signal. If a rising edge is detected, then in step 204 a variable "UP" is incremented by one and the process goes to step 208. In step 208, a determination is made whether the complement of the output signal has a rising edge. If the complement of the output signal has a rising edge, then in step 210 a variable "DWN" is incremented by one. Next, in step 212, a counter variable "COUNT" is incremented by one and in step 214 a determination is made whether the time for sampling is over by comparing COUNT to a variable "X." The value of X is chosen to provide a statistically meaningful number of samples to accurately estimate the duty cycle of the output signal. If COUNT is not greater than or equal to X, then the process cycles back to step 206 for more sampling of the output signal. If COUNT is greater than or equal to X in step 214, then in step 216, a determination is made whether the duty cycle is within a threshold value shown as variable "Y" by subtracting the value of the DWN variable from the value of the UP variable. If the duty cycle is within the threshold value, then the process cycles back to step 206 for more sampling. However, if the duty cycle is not within the threshold Y, then in step 218 a determination is made whether the duty cycle is too high. If the duty cycle is too high, then in step 222 the delay of a delayed signal is decreased by a value "Z." If the duty cycle is too low, then in step 220 the delay of the delayed signal is increased by Z to increase the duty cycle of the output signal. After adjusting the delay of the delayed signal to generate the desired duty cycle in the output signal, the process cycles back to step 206 for more sampling.

FIG. 3 illustrates an embodiment of the present invention shown as duty cycle correction circuit 300. Items 302, 304, 306, 308, 310, and 312 may be used to determine the duty cycle of output 332 as measured from feedback 336 coupled to output 332 through node 346. Output 332 is the output of circuit 300 and the input signal in need of duty cycle correction is shown as x(t) at input 316. To estimate the duty cycle of output 332, D flip-flop 304 transfers the logic state of feedback 336 to UP counter 306 upon rising edges of the input 302. D flip-flops such as 304, 328, and 322 may be any such devices that have outputs (shown as Q, $Q_1$, and $Q_2$) that track the D input (Data input) upon rising edges at the clock input, which is commonly shown with a ">" in D flip-flops. Input 302 has a voltage level that alternates between logic one state and logic zero state. Upon rising edges at input 302, D flip-flop 304 transfers the value on feedback 336 to UP counter 306. Simultaneously, D flip-flop 304 transfers the complement of the value on feedback 336 to the DWN counter 310.

From input 316, the clock signal x(t) is coupled to clock input 350 of the D flip-flop 328 through node 348. On rising edges of input 316, D flip-flop 328 latches output 330 to the logic one state from the rail voltage 338. Each time input 316 has a rising edge, D flip-flop 328 transfers the logic one state from rail voltage 338 to output 330. Similarly, a delayed version of input 316 is transferred to D flip-flop 322 on line 354 to input 352. The delay value used for delaying the signal on input 316 is determined by finite state machine 314 and transferred to delay element 320 over line 318. For each rising edge on the delayed input signal on line 354, D flip-flop 322 transfers the logic one state from rail 340 to output 324. When the level of output 330 and output 324 are both logic one state, AND gate 334 outputs a logic one state at node 326 and resets both D flip-flop 328 and D flip-flop 322. Upon D flip-flop 328 resetting, the voltage of output 330 changes to logic zero state. Likewise, upon a logic one state on node 326, D flip-flop 322 resets and outputs a logic zero state on output 324.

Figure 4:
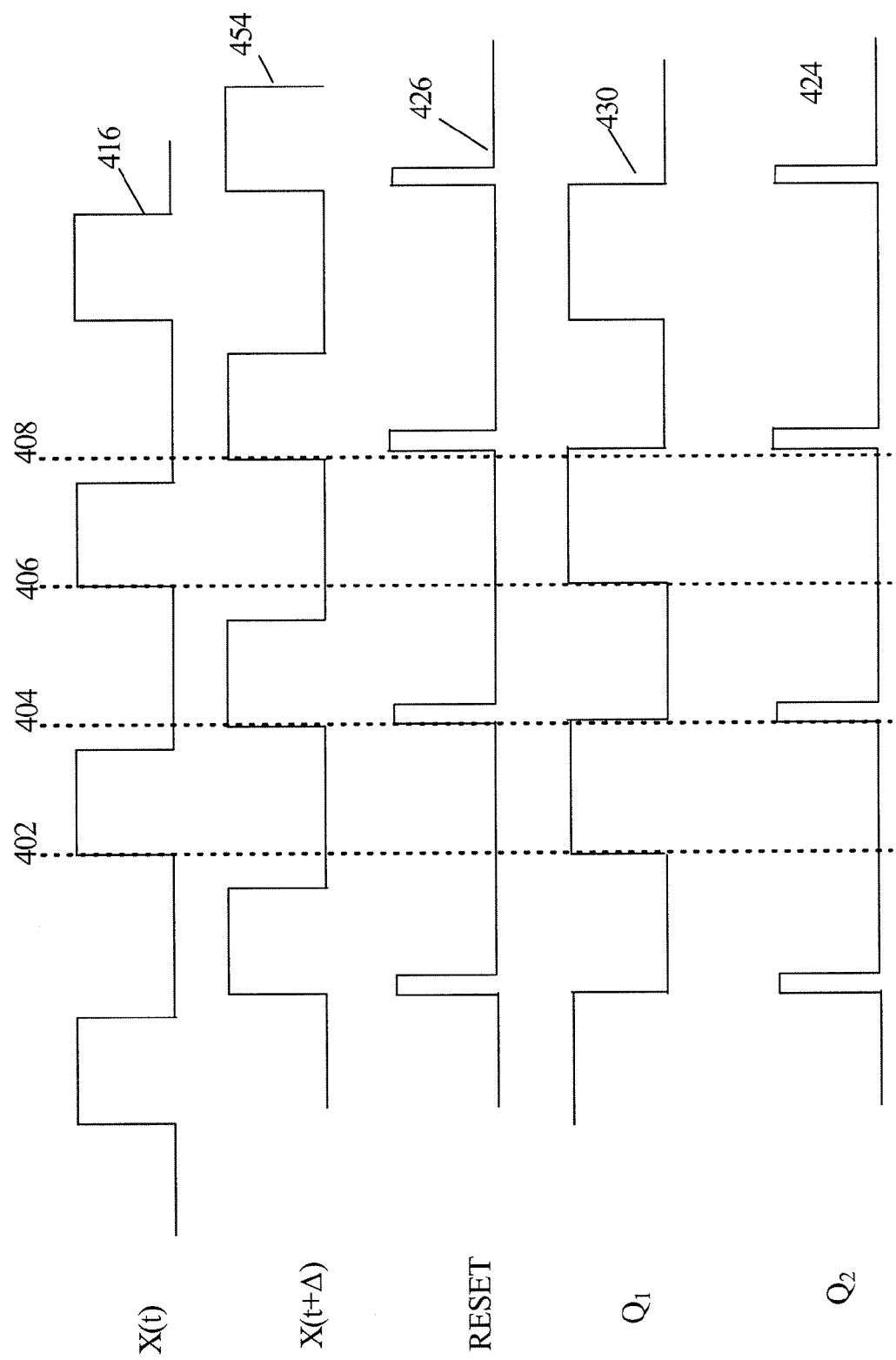
FIG. 4 is a diagram showing the voltage levels at various nodes for the circuit from FIG. 3.

FIG. 4 shows a series of voltage values over time for input 316, delayed input 354, node 326, output 330 and output 324. Waveform 416 shows the voltage level of input 316 (FIG. 3). Lines 402 and 406 represent points in time when there are rising edges on input 316 (FIG. 3) which cause D flip-flop 328 to latch the output 330 to the logic one state from rail 338. Waveform 454 represents the line voltage on line 354 (FIG. 3) which is the output from delay element 320. Waveform 454 is identical to waveform 416, except that corresponding parts of waveform 454 occur a delay period after corresponding parts of waveform 416. Therefore, the period between time 402 and time 404 is equal to the delay value produced by delay element 320 (FIG. 3). Waveform 426 represents the voltage level of the output from AND gate 334 (FIG. 3) at node 326. Waveform 430 represents output 336 from D flip-flop 328 (FIG. 3). Likewise, waveform 424 represents output 324 from D flip-flop 322.

The point in time shown as line 402 in FIG. 4 represents an instant (or short time period) when there is a rising edge at input 350 on D flip-flop 328. Upon such rising edges, the output 330 is latched to logic one state from rail 338. As shown in FIG. 4, just before time 402, only one input to AND gate 334 is logic one state. At time 402, waveform 454, which is the delayed input signal fed to the input 352 of D flip-flop 322, is at logic zero state. When waveform 454 has a rising edge at time 404, output 324 latches to the logic one state from line 354. Therefore, at time 404, both inputs to AND gate 334 are logic one state and the voltage at node 326 transitions from logic zero state to logic one state, causing D flip-flops 328 and 322 to reset. The voltage of node 326 is shown as signal 426 in FIG. 4. Upon this resetting of D flip-flops 328 and 322, the voltage levels on outputs 330 and 324 are driven to logic zero state as shown in signals 430 and 424 (FIG. 4). Therefore, circuit 300 causes a one shot pulse on node 326 because the logic zero state on outputs 324 and 330 cause the output of AND gate 334 to quickly output a logic zero state and the reset condition no longer exists. Similarly, the voltage of output 324 is reset to logic zero state and remains there at least until the next rising edge on waveform 440. On the next rising edge of waveform 416 which occurs at time 406, output 330 becomes logic one state as shown in waveform 430. At time 408, when waveform 440 has the next rising edge, AND gate 334 again has an output of one, resetting D flip-flops 328 and 322.

Waveform 430 from FIG. 4 represents the voltage level at output 332, which has the same voltage as the output of D flip flop 328. In summary, FIG. 4 shows that output 332 has rising edges substantially simultaneously with rising edges of the input 316 (shown as waveform 416). The falling edges of output 332 occur substantially simultaneously with the rising edges of the delayed signal on line 354 (shown as waveform 454). Therefore, output 332 has rising edges that correspond to rising edges at input 316 and falling edges that occur a delay period later at rising edges of the signal (shown as waveform 454) on line 354. Therefore, with circuit 300, the duty cycle of the input 316 (signal x(t)) can be measured and then adjusted by increasing or decreasing the delay produced by delay element 320. Such a circuit is advantageous because the leading edge of input 316 is produced at output 332 with very little delay and the duty cycle of output 332 is adjusted without having to perform delay lock loops or phase lock loop on the signal. In short, the leading edges of input x(t) pass through D flip-flop 328 as output 332 and falling edges of output 332 are adjusted to yield the desired duty cycle.

Figure 5:
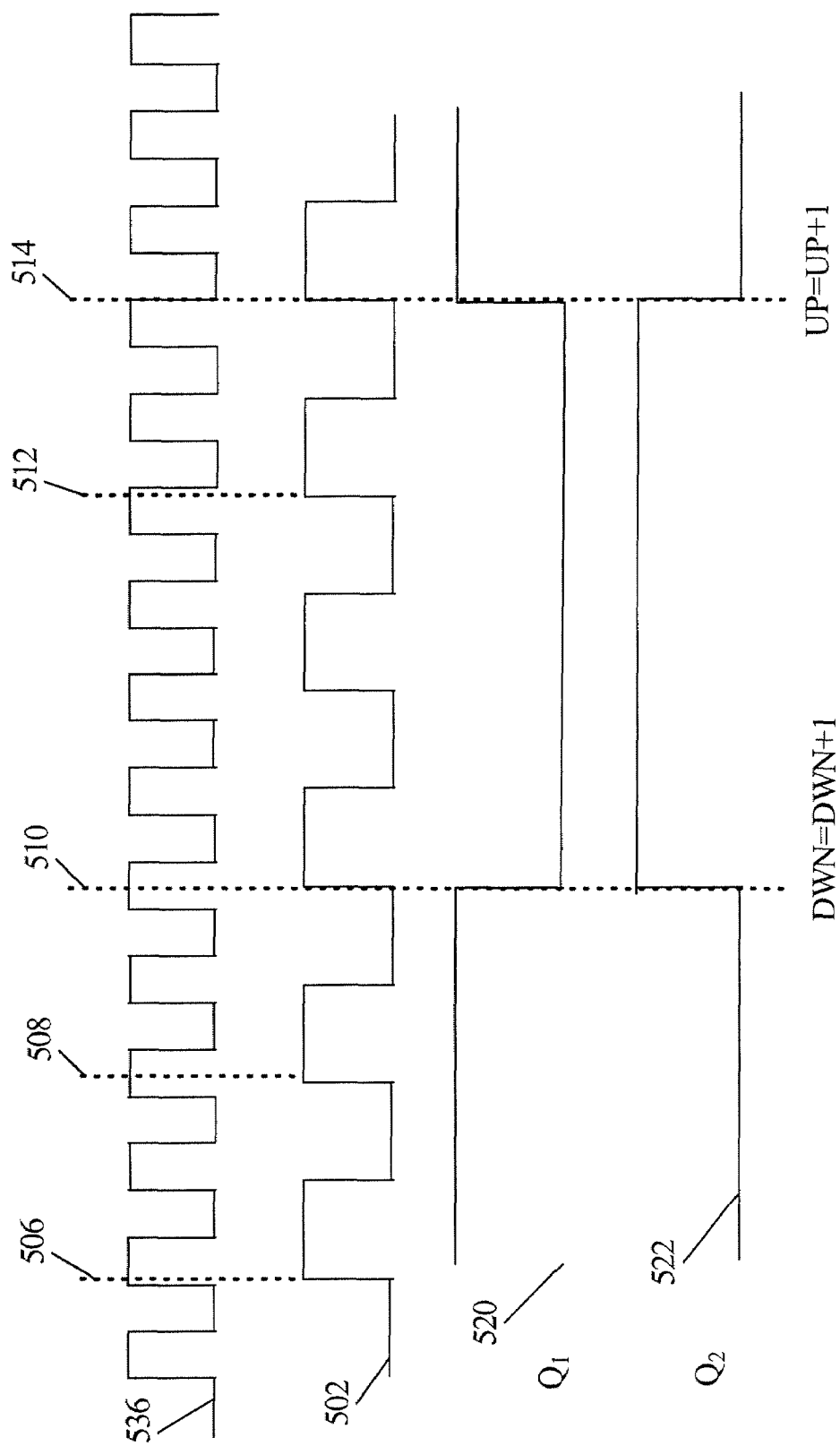
FIG. 5 is a diagram showing the voltage levels at various nodes during operation of the counting elements from FIG. 3.

FIG. 5 shows the timing for sampling of the output signal to estimate the duty cycle at output 332. Waveform 502 corresponds to the voltage level on input 302 to D flip-flop 304 (FIG. 3). As shown in FIG. 3 and FIG. 5, waveform 502 is a digital signal with rising edges that determine when sampling will occur of output 332. Waveform 536 represents the voltage level of an example signal at output 332. On each rising edge of waveform 502, D flip-flop 304 transfers the value from waveform 536 to UP counter 306 (FIG. 3). The waveform fed to the UP counter is shown as item 520 (FIG. 5). At times 506 and 508, waveform 520 is latched to the value of waveform 536, which happens to be logic one state both at time 506 and time 508. However, on the third rising edge of waveform 502 shown at time 510, waveform 536 is at logic zero state, and the Q output 356 of D flip-flop 304 latches to a logic zero state shown as signal 520. The complement of Q at output 358 is shown as waveform 522 and is output to the DWN counter 310 (FIG. 3). At time 510, a rising edge on waveform 522 causes the DWN counter 310 (FIG. 3) to increment by one count. The rising edge on waveform 520 represents a positive edge which causes UP counter 306 (FIG. 3) to increment. Using this circuit arrangement, the duty cycle at output 332 can be estimated using count values from UP and DWN counters 306 and 310.

Figure 6:
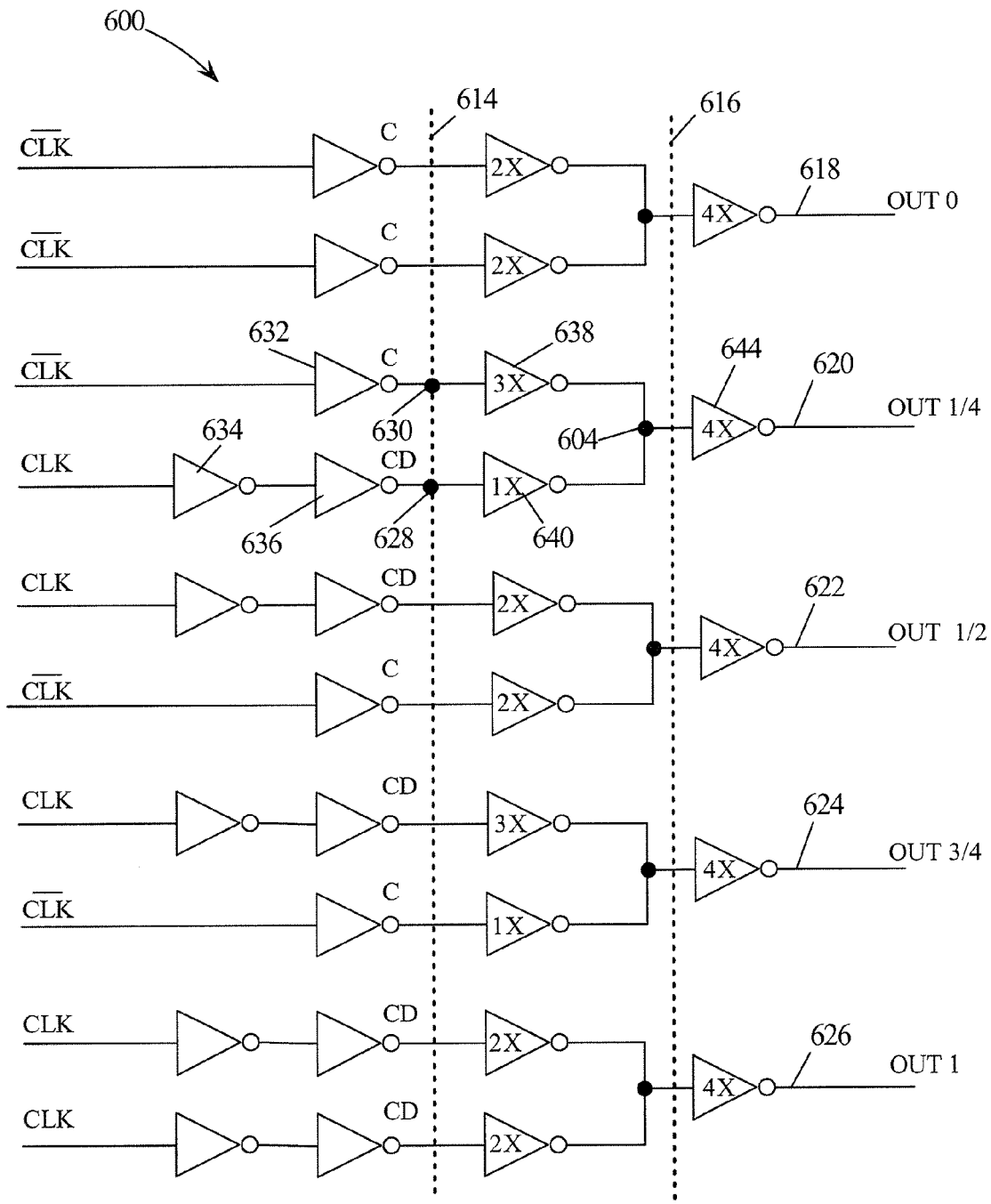
FIG. 6 is a circuit diagram of an example circuit for delaying a clock signal in accordance with one embodiment of the present invention.

FIG. 6 is a circuit diagram of representative circuitry suitable for delay element 320 (FIG. 3). Node 630 has a voltage level determined by CLK's complement with a one gate delay caused by inverter 632. Node 628 has a voltage level determined by CLK but delayed by two inverters 634 and 636. Waveform 830 (FIG. 8) illustrates the voltage over time for an example signal at node 630. Similarly, waveform 828 (FIG. 8) illustrates the corresponding voltage level over time for node 628. The time difference between corresponding parts of signals 830 and 828 (FIG. 8) is equal to the time delay caused by inverter 634 (FIG. 6), since inverter 634 acts as an extra delay element in the path of node 628 (FIG. 6) as compared to the path of node 630 (FIG. 6).

Figure 7A:
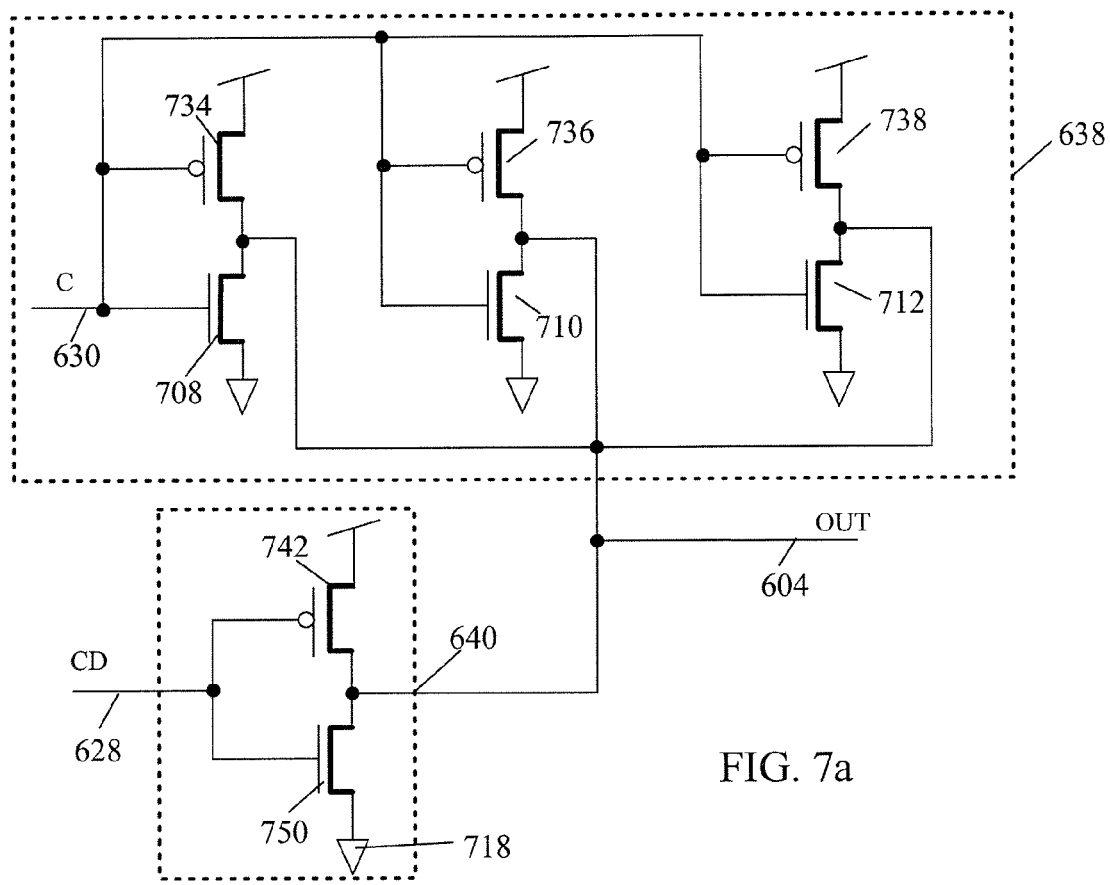
FIG. 7($a$) is a circuit diagram for implementing the 3X and 1X inverters from FIG. 6 in accordance with one embodiment of the present invention.

As shown in FIG. 6, inverter 638 may be a single inverter which is three times the size of inverter 640. In the alternative, inverter 638 may be three inverters in parallel as shown in FIG. 7(a). Inverter 640 (FIG. 6) can be achieved by PFET transistor 742 and NFET transistor 750 as shown in FIG. 7(a).

Figure 7B:
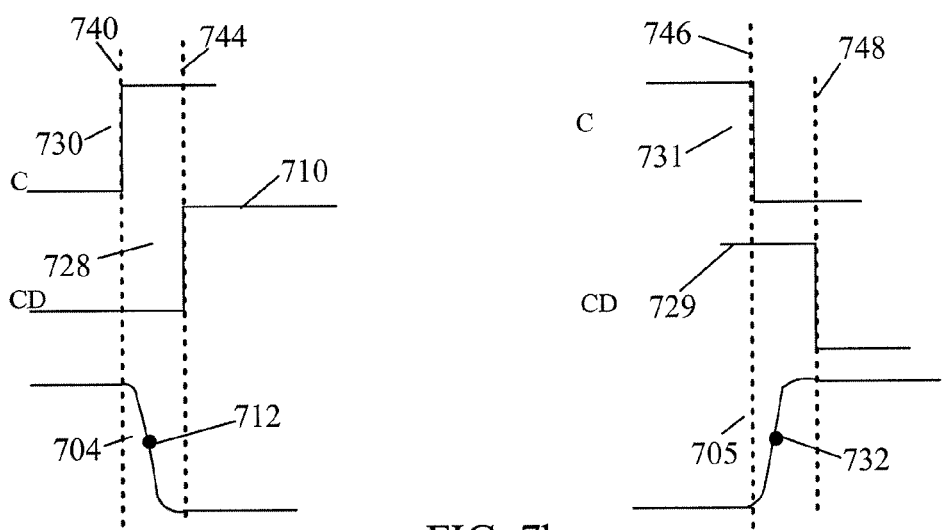

Referring to FIG. 7(b), waveform 704 illustrates a response voltage level at node 604 (FIG. 7(a)) from the application of waveform 730 to node 630 (FIG. 7(a)) and waveform 728 to node 628 (FIG. 7(a)). Likewise, waveform 705 illustrates response voltage level at node 604 (FIG. 7(a)) from the application of waveform 731 to node 630 (FIG. 7(a)) and waveform 729 to node 628 (FIG. 7(a)). A function of the circuitry shown in FIG. 7(a) is to accomplish an output 604 that is shifted one quarter of the time period in the direction of waveform 730 (the voltage at node 630) as compared to waveform 728 (the voltage at node 628). Waveform 730 represents a rising edge on node 630. Waveform 728 represents a corresponding rising edge on node 628. Waveform 728 has a rising edge a gate delay after the corresponding rising edge of signal 730. While signal 730 and 728 are both logic zero state, the output at node 604 (shown as signal 704) is driven to logic one state. However, in response to the rising edge of signal 730 at time 740, the PFET transistors shown as items 734, 736 and 738 (FIG. 7(a)) turn OFF and the NFET transistors shown as items 708, 710 and 712 turn ON and begin pulling node 604 toward ground (logic zero state). At time 740, waveform 728 is at logic zero state which means the PFET transistor 742 is still ON and attempts to drive output 604 to logic one state. Therefore, between time 740 and time 744, inverters 638 and 640 compete to drive output 604 because inverter 638 pulls output 604 to ground while inverter 640 pulls output 604 to logic one state. Since inverter 638 is a larger device, output 604 will be pulled to ground rapidly and waveform 704 (i.e., output 604) will be inverted and shifted about one quarter of the way from waveform 730 to waveform 728. The point shown as item 712 represents the threshold voltage level for inverter 644 in FIG. 6.

Waveforms 731 and 729 in FIG. 7(b) represent falling edges applied to inputs 630 and 628, respectively, to achieve the response shown as waveform 705. Waveform 729 is a falling edge that occurs a delay period after the corresponding falling edge in waveform 731. Before time 746, both waveform 731 and waveform 729 are at logic one state, which results in a logic zero state in waveform 705. At time 746, waveform 731 collapses to logic zero state. This corresponds to a change in input 630 from logic one state to logic zero state. As a result, the NFET transistors 708, 710 and 712 turn OFF and the PFET transistors 734, 736 and 738 turn ON and tend to drive node 604 to a logic one state. During the period between time 746 and time 748, the three PFET transistors 734, 736 and 738 pull output 604 to logic one state while NFET transistor 750 attempts to pull output 604 to ground (logic zero state). The three PFET transistors 734, 736 and 738 pulling against the one NFET transistor 750 result in a rapid rise to logic one state at output 604, shown as waveform 705 in FIG. 7(b). Point 732 represents the threshold voltage for inverter 644 from FIG. 6. The threshold voltage 732 occurs about one quarter of the period between time 746 and time 748.

The circuit diagrams shown in FIGS. 6 and 7(a) are included as examples and are not intended to limit the subject matter of the claims to particular hardware implementations. FIG. 6 shows a scheme for achieving a resolution for one quarter of the time between two waveforms, however, by using more or less devices, greater or less resolution can be achieved. Using other such hardware schemes, any resolution of phase shift can be achieved by varying the ratio of devices that compete to pull an output node to either logic one state or logic zero state.

Figure 8:
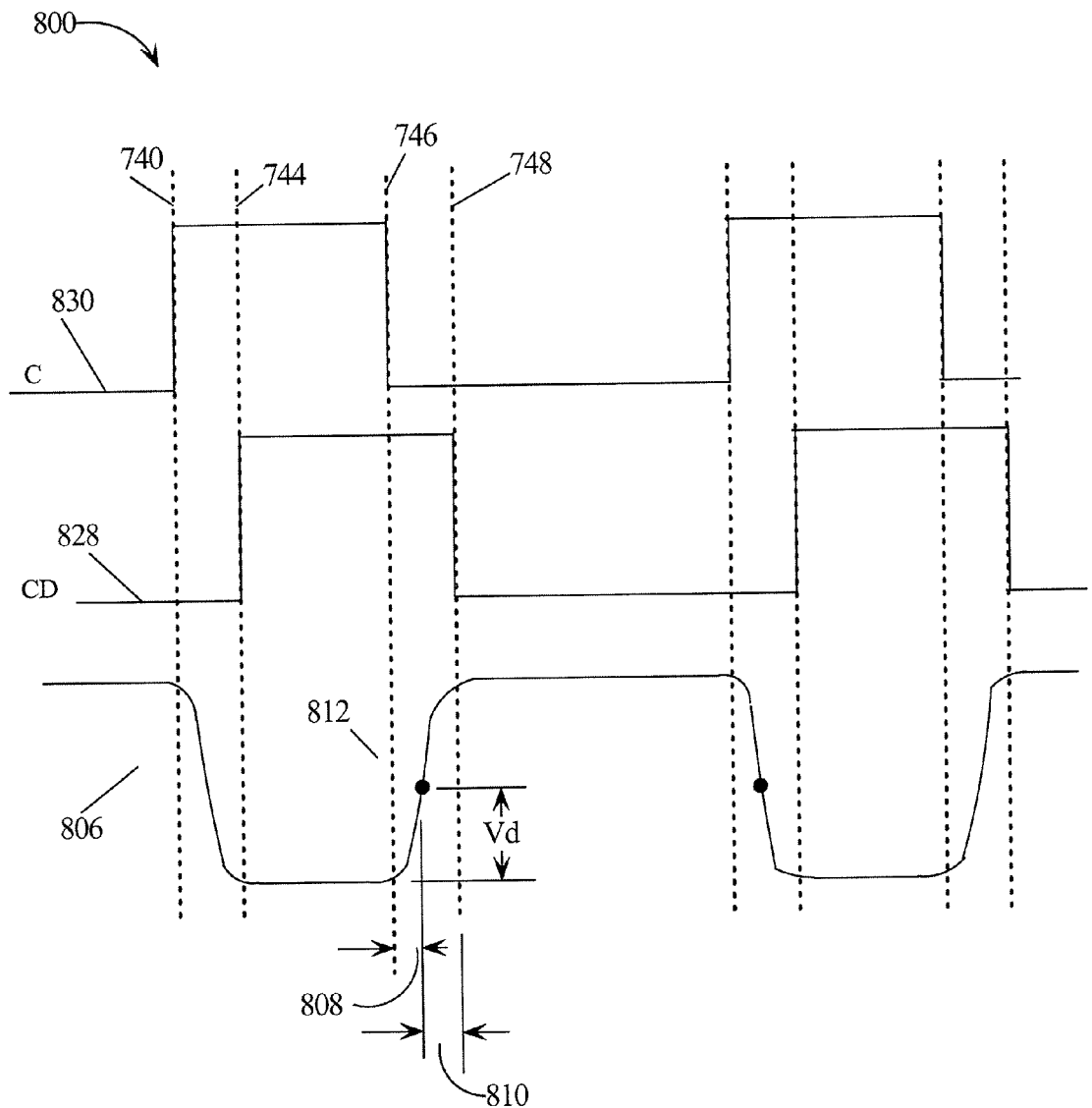
FIG. 8 is a diagram of voltage levels at various nodes over multiple clock cycles for the circuit shown in FIG. 7($a$)

FIG. 8 illustrates example response waveform 806 to show how inverters 638 and 640 (FIG. 7(a)) would respond to inputs at nodes 630 and 628 over multiple clock cycles. Likenumbered items correspond in FIG. 8 and FIG. 7(b). Waveform 830 represents a voltage applied to node 630 and waveform 828 represents a voltage applied to node 628. Waveform 806 represents the voltage output at node 604 produced by inverters 638 and 640. At time 740, the voltage at node 630 (shown as signal 830) transitions from a logic zero state to a logic one state and consequently the 3X device shown as inverter 638 attempts to pull node 604 to ground by turning on NFET transistors 708, 710 and 712 (FIG. 7(a)). During the subsequent period between time 740 and time 744, inverter 638 pulls node 604 to logic zero state while inverter 640 competes to drive node 604 to logic one state. At time 744 (FIG. 8), waveform 828 (voltage on node 638) transitions to a logic one state and node 604 is then pulled to logic one state by both inverters 638 and 640. Upon reaching logic zero state, node 604 is then held at logic zero state by inverters 638 and 640 until time 746 (FIG. 8) when the 3X inverter (inverter 638) is fed a logic zero state on node 630. Next, during the period between times 746 and 748 (FIG. 8), the 3X device shown as inverter 638 pulls node 604 to a logic one state while the 1X device shown (inverter 640) pulls node 604 to logic zero state. At time 748, both waveforms 830 and 828 are at logic zero state and therefore both inverter 638 and inverter 640 pull node 604 to logic one state.

As shown in FIG. 8, item 808 represents a period of time which is about one third the duration of time shown as item 810. Point 812 represents the threshold voltage for inverter 644 (FIG. 6). Therefore, the threshold voltage of inverter 644 occurs one quarter of the way from time 746 to time 748. In this way, a signal can be delayed a desired amount by passing the signal through a delay and using devices of varying sizes to compete, resulting in a shift in the phase of the signal.

Figure 9:
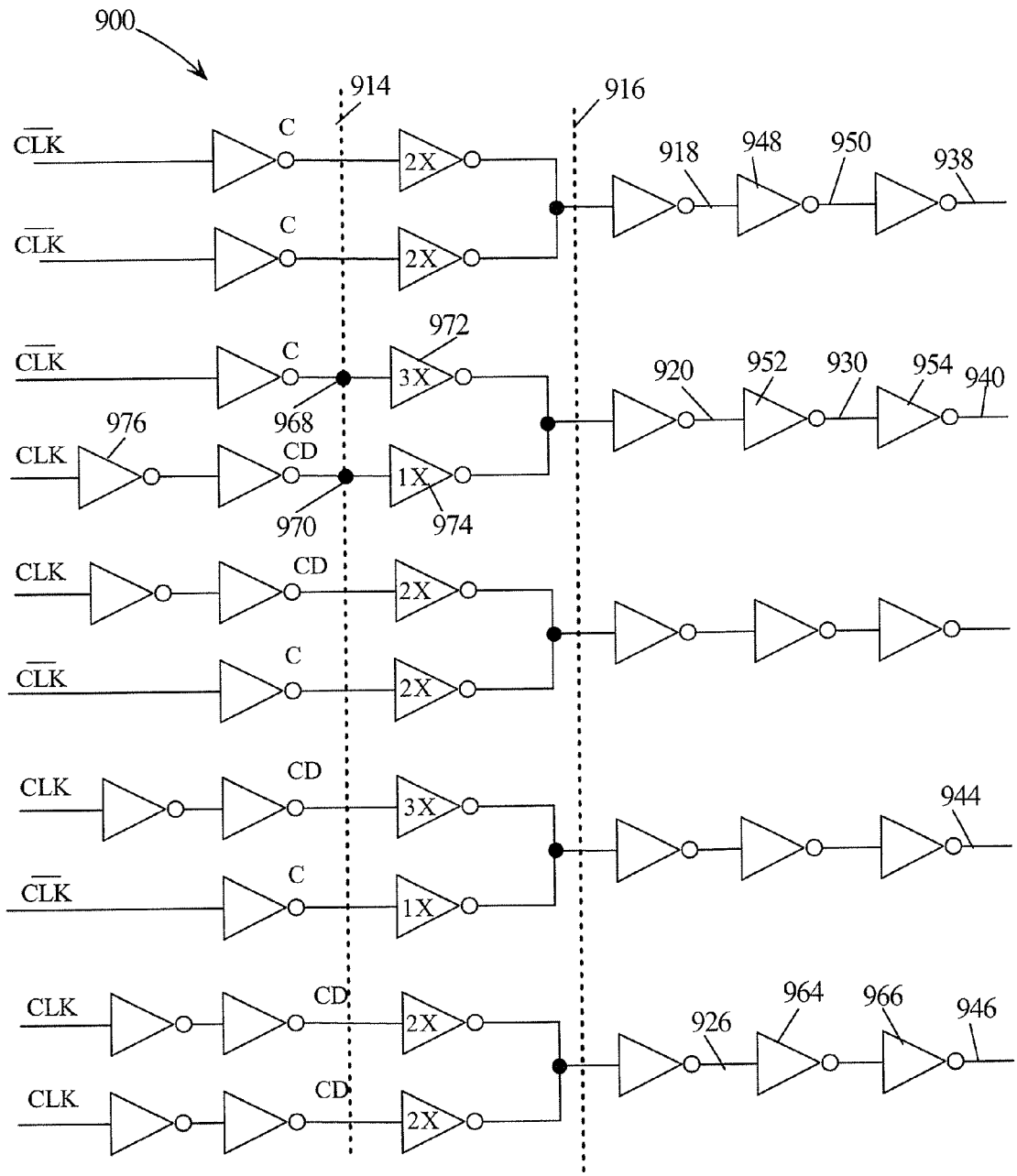
FIG. 9 is a circuit diagram of an example circuit for delaying a clock signal in accordance with one embodiment of the present invention.

FIG. 9 is a circuit diagram illustrating example circuitry 900 for obtaining delays in accordance with an embodiment of the present invention. Circuitry 900 may be used in circuit 300 (FIG. 3) as delay element 320. Circuitry 900 is similar to circuitry 600 (FIG. 6), except circuitry 900 has additional delay elements.

As explained above with reference to nodes 628 and 630 (FIG. 6), the time difference between corresponding elements of the signal at node 968 and 970 is equal to the time delay caused by the extra inverter (item 976) to the left of node 970 as compared to node 968. Also, with respect to FIG. 6, the signals at the outputs (i.e. nodes 618, 620, 622, 624, 626) of FIG. 6 have delays of 0%, 25%, 50%, 75%, and 100% of the delay of one inverter. A delay of 25% in circuit 600 means that the signal is delayed by a time equal to 25% of the delay caused by one inverter. The same such delays as achieved by circuitry 600 can be achieved by circuitry 900. For example, the voltage at node 920 (FIG. 9) would be shifted 25% of the delay caused by inverter 976. However, to achieve a shift of 225%, two inverters 952 and 954 can be employed. This yields a 225% delay at node 940, where the 225% delay is equal to 2.25 times the delay caused by one inverter. Likewise, at node 938 there is a signal with 200% delay. This delay is caused by inverters 948 and 950 delaying by 100% apiece the signal at node 918. Similarly, the signal at node 944 would be delayed by 275% of the delay caused by one inverter. Still further, the signal at node 946 would be delayed by 300%, since the signal at node 926 is delayed by 100% and inverters 964 and 966 each cause a delay of 100%. Therefore, using circuitry such as that shown in FIG. 9, delays of more than 100% of a delay element can be achieved.

Although the present invention and its advantages have been described in detail, it should be understood that various changes, substitutions and alterations can be made herein without departing from the spirit and scope of the invention as defined by the appended claims.

What is claimed:

1. A method for correcting the duty cycle of a clock signal, the method comprising the steps of:
   receiving the clock signal at an input node, wherein the clock signal comprises a plurality of clock rising edges and a plurality of clock falling edges;
   estimating the duty cycle of the clock signal, wherein estimating the duty cycle of the clock signal comprises sampling a voltage level of the output node to estimate a duty cycle at the output node;
   triggering a rising edge at an output node in response to a rising edge of the clock signal;
   producing a delayed clock signal by delaying the clock signal by a time period, wherein the delayed clock signal comprises a plurality of delayed rising edges and a plurality of delayed falling edges, wherein each of the plurality of delayed rising edges occurs substantially the time period after each of the plurality of clock rising edges, wherein each of the plurality of delayed falling edges occurs substantially the time period after each of the plurality of clock falling edges; and
   producing a falling edge at the output node in response to each of the plurality of delayed rising edges.

2. The method of claim 1, wherein the step of triggering a rising edge at an output node comprises producing a rising edge at the output node one gate delay after the rising edge of the clock signal.

3. The method of claim 2, the method further comprising the step of:
   estimating the time period in response to comparing the duty cycle at the output node to a desired duty cycle.

4. The method of claim 1, wherein the step of receiving a clock signal at the input node comprises receiving a feedback signal from the output node.

5. The method of claim 1, the method further comprising the step of:
   determining whether the duty cycle of the clock signal is within a tolerance.

6. The method of claim 5 wherein the step of estimating the duty cycle of the clock signal occurs by sampling the clock signal at regular intervals when sampling occurs in response to an oscillating signal.

7. The method of claim 5, wherein the step of estimating the duty cycle of the clock signal further comprises comparing a first number of times the clock signal is logic one state to a second number of times the clock signal is logic zero state.

8. The method of claim 1, wherein the step of triggering a rising edge at an output node comprises passing a rising edge of the clock signal to an output node through a switch.

* * * * *

UNITED STATES PATENT AND TRADEMARK OFFICE
CERTIFICATE OF CORRECTION

PATENT NO. : 7,667,513 B2  Page 1 of 1
APPLICATION NO. : 10/988454
DATED : February 23, 2010
INVENTOR(S) : Carpenter et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 654 days.

Signed and Sealed this

Seventh Day of December, 2010

David J. Kappos
*Director of the United States Patent and Trademark Office*